(12) United States Patent
Halope et al.

(10) Patent No.: US 8,038,831 B2
(45) Date of Patent: Oct. 18, 2011

(54) RADIO FREQUENCY IDENTIFICATION DEVICE SUPPORT FOR PASSPORT AND ITS MANUFACTURING METHOD

(75) Inventors: Christophe Halope, Cannes (FR); Olivier Mazabaud, Antibes (FR)

(73) Assignee: ASK S.A., Sophia Antipolis (FR)

( * ) Notice: Subject to any disclaimer, the term of this patent is extended or adjusted under 35 U.S.C. 154(b) by 108 days.

(21) Appl. No.: 12/250,404

(22) Filed: Oct. 13, 2008

(65) Prior Publication Data
US 2009/0120564 A1 May 14, 2009

(30) Foreign Application Priority Data

Oct. 11, 2007 (FR) ..................................... 07 07143
Apr. 8, 2008 (FR) ..................................... 08 01931

(51) Int. Cl.
*B29C 65/54* (2006.01)
*B32B 37/02* (2006.01)
*B32B 37/12* (2006.01)
*H01L 21/02* (2006.01)
*B29C 65/02* (2006.01)
*B32B 37/10* (2006.01)

(52) U.S. Cl. ........ 156/293; 156/290; 156/325; 438/106; 438/107; 438/108

(58) Field of Classification Search .................. 156/290, 156/293, 325; 438/106–108; 340/572.7, 340/572.8
See application file for complete search history.

(56) References Cited

U.S. PATENT DOCUMENTS

| | | | |
|---|---|---|---|
| 6,404,643 B1 | 6/2002 | Chung | 361/737 |
| 6,421,013 B1* | 7/2002 | Chung | 343/700 MS |
| 6,617,676 B1 | 9/2003 | Oddou et al. | 257/679 |
| 6,770,509 B2* | 8/2004 | Halope et al. | 438/108 |
| 7,116,231 B2* | 10/2006 | Kayanakis et al. | 340/572.7 |
| 7,688,209 B2* | 3/2010 | Halope | 340/572.8 |
| 7,710,276 B2* | 5/2010 | Halope et al. | 340/572.8 |
| 7,714,724 B2* | 5/2010 | Halope et al. | 340/572.1 |
| 2002/0192856 A1* | 12/2002 | Halope et al. | 438/106 |
| 2003/0052177 A1 | 3/2003 | Halope | 235/492 |

(Continued)

FOREIGN PATENT DOCUMENTS

FR 2782821 3/2000

(Continued)

OTHER PUBLICATIONS

English translation of FR2782821; Martin, David. Mar. 2000.*

*Primary Examiner* — Sonya Mazumdar
(74) *Attorney, Agent, or Firm* — James C. Lydon

(57) ABSTRACT

A method for manufacturing an identity booklet cover provided with a radio frequency identification device having an antenna and a chip (12) connected to the antenna, the method including the following steps:
  producing an antenna (12) having contacts (13 and 14) on a support (10),
  creating a recess (20) between the contacts (13 and 14),
  placing adhesive dielectric material (25, 26) near the contacts of the antenna,
  positioning an integrated circuit module (19) on the support so that the groups of contacts of the module are opposite the contacts of the antenna and the encapsulation of the module is in the recess (20),
  placing on the face of the support featuring the antenna at least one layer of thermo-adhesive film (40, 50, 60),
  placing a cover layer (70) on the layer (or) layer(s) (40 or 50 and 60) of thermo-adhesive film,
  laminating all the layers.

7 Claims, 5 Drawing Sheets

U.S. PATENT DOCUMENTS

| | | | |
|---|---|---|---|
| 2003/0136503 A1 * | 7/2003 | Green et al. | 156/264 |
| 2005/0197074 A1 * | 9/2005 | Cullen et al. | 455/90.3 |
| 2006/0176181 A1 | 8/2006 | Halope | 340/572.8 |
| 2006/0285301 A1 | 12/2006 | Provost et al. | 361/737 |

FOREIGN PATENT DOCUMENTS

| | | | |
|---|---|---|---|
| FR | 2782821 A1 * | 3/2000 | |
| FR | 2877462 | 5/2006 | |
| WO | WO 2006048577 A1 * | 5/2006 | |

* cited by examiner

RADIO FREQUENCY IDENTIFICATION DEVICE SUPPORT FOR PASSPORT AND ITS MANUFACTURING METHOD

TECHNICAL FIELD

This invention concerns radio frequency identification devices designed to be built into objects such as security documents and specifically concerns a radio frequency identification device support for passport and its manufacturing method.

BACKGROUND ART

Contactless Radiofrequency Identification Devices (RFIDs) are increasingly used for identification of persons moving about in controlled access zones or transiting from one zone to another. A contactless RFID is a device made up of an antenna and a chip connected to the terminals of the antenna. The chip is usually not powered and receives its energy by an electromagnetic coupling between the antenna of the reader and the antenna of the RFID, information is exchanged between the RFID and the reader and particularly information stored in the chip that relates to the identification of the holder of the object on which the RFID is located and to his/her authorization to enter into a controlled access zone.

In this manner, passports can incorporate RFIDs to identify the passport holder. The chip memory contains information such as the identity of the passport holder, his/her country of origin, his/her nationality, visas of different countries visited, dates of entry, restrictions of movements, biometric elements, etc.

Generally, the RFID device is manufactured separately from the passport to be incorporated afterwards by gluing between the cover and the bottom flyleaf of the passport, for example. The RFID device featuring the antenna and the chip connected together is then integrated into a support made of paper, plastic or other (commonly referred to as "inlay").

Such supports generally include at least two stiff layers between which is inserted the RFID device. The drawback of such supports is their lack of flexibility due to their multi-layer structure.

SUMMARY OF THE INVENTION

This is why the purpose of this invention is to counter these drawbacks by offering a RFID device designed to be incorporated into an identity booklet such as a passport, having good properties of flexibility while ensuring a reliable connection between the integrated circuit module and the antenna.

Another object of the invention is to provide a cover for an identity booklet such as a passport integrating such a radio frequency identification device without any visible mark of the chip on the outside of the booklet's cover.

The purpose of the invention is therefore a manufacturing method of an identity booklet cover provided with a radio frequency identification device (RFID), the device featuring an antenna and a chip connected to the antenna, the method including the following steps:

producing an antenna featuring contacts on a paper or synthetic paper support, creating a recess between the contacts of the antenna, placing adhesive dielectric material on the antenna support near the antenna contacts, positioning an integrated circuit module on the support, the module featuring groups of contacts and the chip connected to groups of contacts inside an encapsulation of the module, so that the contacts of the module are opposite the contacts of the antenna and the module is encapsulated into the recess, placing on the face of the support featuring the antenna at least one layer of thermo-adhesive film, placing a cover layer on the layer (or) layer(s) of thermo-adhesive film, laminating together the support layer, the layer (or) layer(s) of thermo-adhesive film and the cover layer.

BRIEF DESCRIPTION OF THE DRAWINGS

The purposes, objects and characteristics of the invention will become more apparent from the following description when taken in conjunction with the accompanying drawings in which.

DETAILED DESCRIPTION OF THE INVENTION

Figure 1:
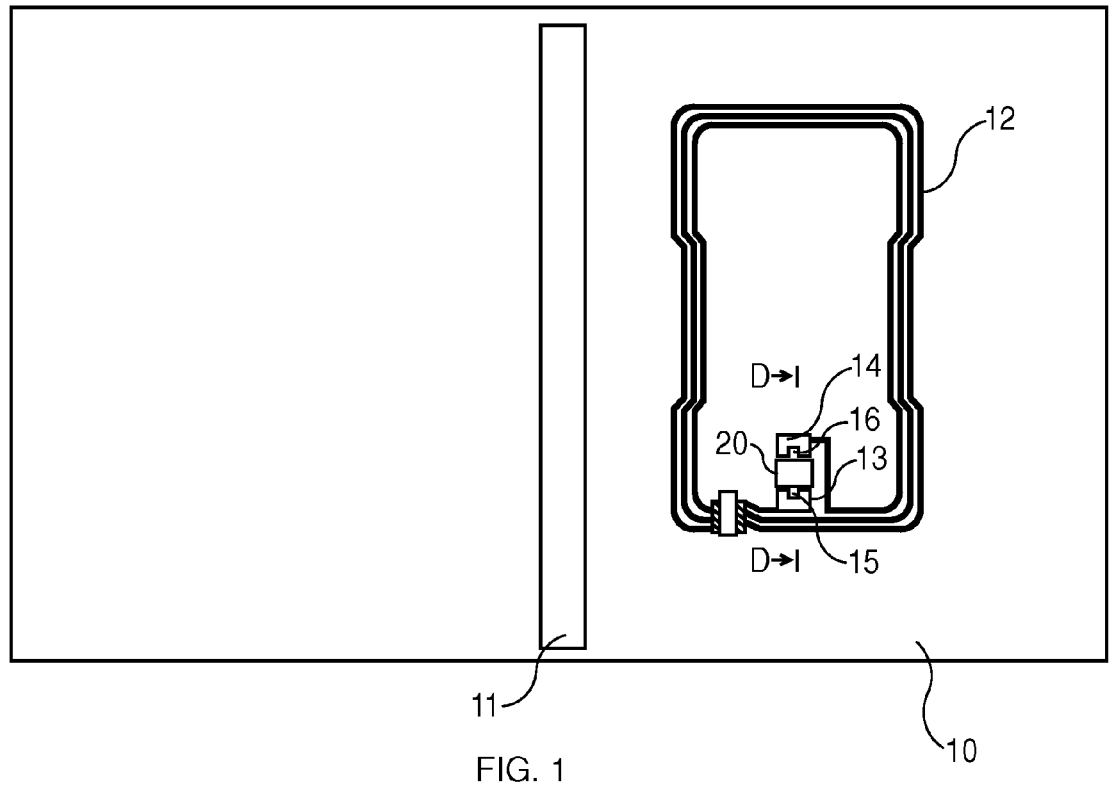
FIG. 1 represents the top view of the antenna support and the antenna of the RFID device according to the invention.

According to the first step of the manufacturing method, an antenna is made on a support layer 10. The antenna features a set of one or more turns 12. The turns are made by screen printing, flexography, rotogravure, offset printing or inkjet printing with epoxy type conductive ink loaded with conductive particles such as for example silver or gold or with a conductive polymer. The support layer 10 is made of a material such as paper or synthetic paper. The paper is made up of pulped plant fibers and as a result has a fibrous structure. The core of the paper tends to delaminate when it is subjected to shear stresses, whereas non fibrous synthetic paper has a microporous structure and has a low density. Like paper, synthetic paper simplifies the lamination operation carried out at temperatures in the order of 160° C., as it is stable at these temperatures; unlike thermoplastic film materials such as PVC or PETG, it does not creep. The synthetic paper used consist of one single non-oriented layer of a polymer such as polyethylene or polypropylene loaded with minerals between 40 and 80%. Its composition gives it a low density in the order of 0.57 g/cm$^3$ owing to its microporous network. The thickness of the support layer is between 240 and 280 µm and is preferably 250 µm. The support 10 features an opening 11 corresponding to the location of the joint of the identity booklet.

Figure 2:
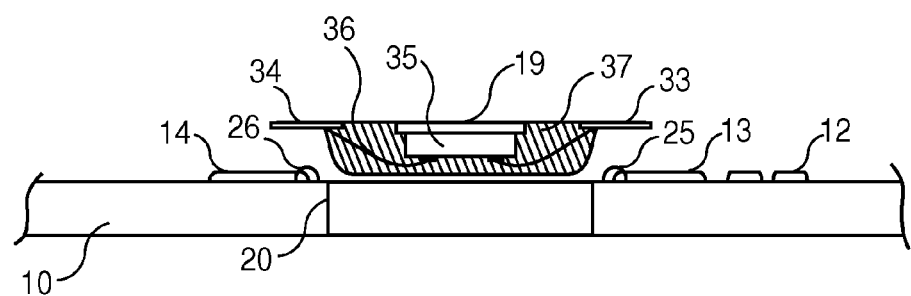
FIG. 2 represents the antenna support and the integrated circuit module according to a D-D section in FIG. 1.

According to FIG. 2, an integrated circuit module 19 features a chip 35, at least two groups of contacts 33 and 34. The connection between the chip and the groups 33 and 34 is made by very small conductive wires or connecting cables, referred to as "wire bonding". The chip 35 and the wires are encased in a resistant material-based protective resin 37 that does not conduct electricity. The encapsulation 37 is in a way a stiff shell that includes the chip and its wiring in order to make it less fragile and easier to handle. The encapsulation has a thickness between 200 and 240 µm. The module thus presents on its upper face a flat surface corresponding to the upper portion of the encapsulation 37 and on its lower face groups of contacts 33 and 34 designed to connect to a circuit. The groups 33 and 34 are made of conductive material such as aluminum and their thickness is between 70 and 100 µm.

The module 19 shown in FIG. 2 is designed to connect to the antenna on antenna contacts. As part of the invention, only two contacts 13 and 14 are sufficient to connect the module. The contacts 13 and 14 are the continuity of the antenna; as a result they are in the extension of turns of the antenna and are generally made of the same material as the antenna. The contacts are thus also made by screen printing, flexography, rotogravure, offset printing or inkjet printing with epoxy type conductive ink loaded with conductive particles such as for example silver or gold or with a conductive polymer. The thickness of contacts is between 5 and 10 µm.

Figure 3:
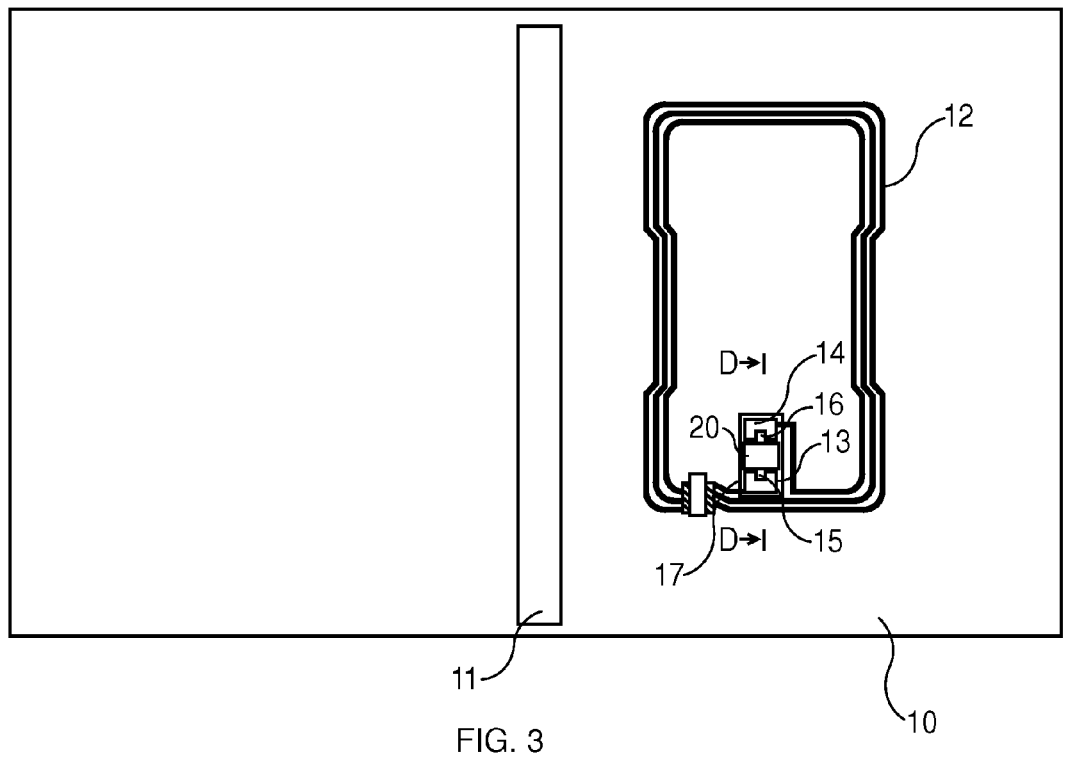
FIG. 3 represents the top view of the antenna support and the antenna of the RFID device according to a variant of the invention.
Figure 4:
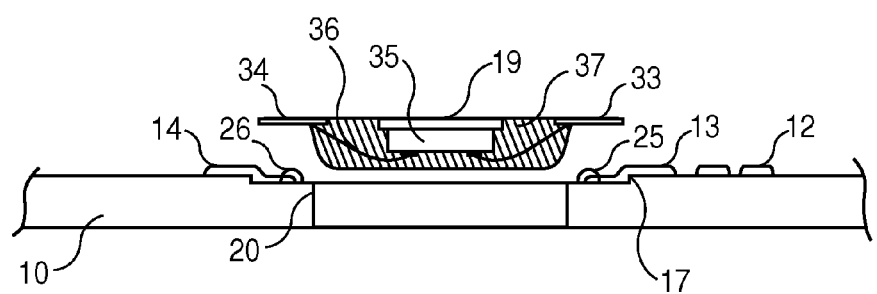
FIG. 4 represents the antenna support and the integrated circuit module according to a D-D section in FIG. 3.

According to a variant of the invention shown in FIGS. 3 and 4, the support layer 10 is embossed with a thickness between 50 and 60 µm. The embossing step consists in compressing a part of the support layer 10 using a press so that it thus maintains the imprint of the press. The shape of the press used is such that it leaves a rectangular imprint 17 slightly larger than the module. The embossing step is done before making the antenna. All the following steps remain unchanged in relation to the method without embossing, and particularly the description of the installation step of the module that will follow is the same. The thickness of the support layer 10 in this case is preferably equal to 300 µm.

The module 19 is glued on the antenna support layer 10 by means of two contacts of adhesive material 25 and 26 placed by the side of the antenna contacts so that the contacts 13 and 14 of the antenna are opposite the groups of contacts 33 and 34 of the module and so that the encased portion of the module or encapsulation 37 is in the recess 20. And particularly, the contacts 13 and 14 are opposite the portion of the groups of contacts 33 and 34 not covered with adhesive material. The adhesive material used for the contacts 25 and 26 is a glue that fixes only the module to the support layer 10 and, as this glue is non-conducting, it does not directly participate in the electrical connection between the module and the antenna. The glue used is cyanoacrylate type glue. The spots of glue are placed on the support layer 10 near the antenna supports so that, when the module 19 is installed in the recess 20, the glue of the contacts is squashed by the groups of contacts of the module until they come in contact with the antenna contacts. The spots of glue then attain the same or substantially the same thickness as the antenna contacts and become flush with the antenna contacts. The proximity of spots of glue and the antenna contacts ensures the reliability of the electrical connection. In this manner, as soon as the module 19 is installed in the recess 20, the electrical connection is made by the portion in contact with the groups of contacts of the module and the contacts 13 and 14 of the antenna. The support thus obtained is an antenna support equipped with an integral module of the support and electrically connected to the antenna. Preferably, the antenna contacts have a concave or hollow shape or are hollowed out like a ring so that the contacts of adhesive material are placed inside the hollow part of the concave shape or inside the recess. In a preferred embodiment of the invention, the antenna contacts are U-shaped so that the contacts of adhesive material are placed inside the U and are thus almost entirely surrounded by antenna contacts. This way, the electrical connection has the advantage of being made without welding or supplying material.

Figure 5:
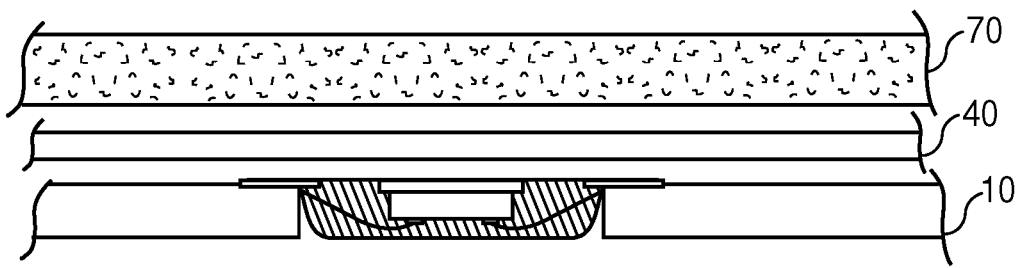
FIG. 5 represents a section of various layers that make up the electronic cover of the invention according to a first embodiment example.
Figure 6:
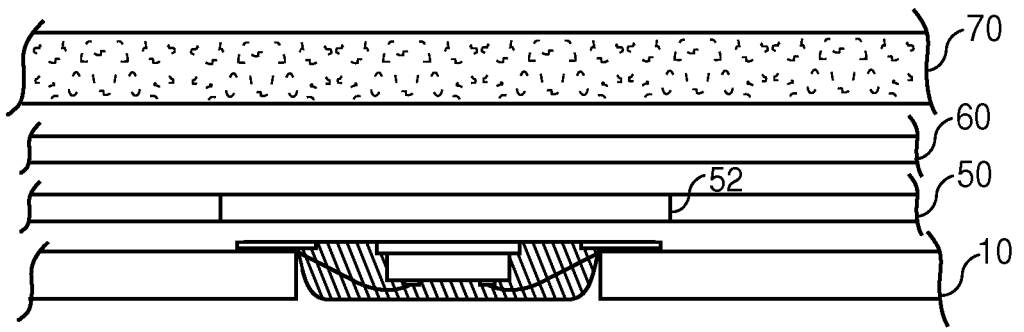
FIG. 6 represents a section of various layers that make up the electronic cover of the invention according to a second embodiment example.

The next step of the method is shown in FIGS. 5 and 6 according to two different modes. In the first embodiment example and with reference to FIG. 5, a layer of thermo-adhesive film 40 is placed directly on the antenna support on the side of the antenna and on the lower face of the module. A second layer 70 is placed on the thermo-adhesive film layer 40. This layer corresponds to the cover of the identity booklet and has a thickness of approximately 350 µm. The cover layer 70 has a paper or textile base covered by a layer of polyester. It can include on its free side 72 a particular grain making it tamper-resistant. However, it is also possible to subject the free side of the booklet's cover during lamination or thereafter to a plate having special raised designs to produce a particular grain on the cover.

In a second embodiment example of the invention and with reference to FIG. 6, an initial layer of thermo-adhesive film 50 is placed directly on the antenna support on the side of the antenna and on the lower portion of the module. The layer 50 features a recess 52 whose dimensions are close to the dimensions of the total surface of the module. In this manner, the edges of the recess 52 match the outside edges of the module, including the contacts. In this way, when the layer 50 is in place on the layer of the antenna support 10, the module 19 is located in the recess 52. A second layer 60 is positioned on the first layer 50. The layer 60 is also a thermo-adhesive film preferably featuring the same properties as the layer 50 and not featuring any recesses. A layer 70 is placed on the thermo-adhesive film layer 60. The adhesive properties of the thermo-adhesive film layers 40, 50 and 60 are activated under the action of heat. These layers have a respective thickness of approximately 50 µm.

The first embodiment example corresponding to a single thermo-adhesive layer 40 is more adapted to the case where the support layer 10 is embossed at the location of the module according to FIGS. 3 and 4. Actually, in this case, the groups of contacts of the module are partly or totally embedded in the thickness of the support layer 10 and, as a result, only one thermo-adhesive layer is sufficient to eliminate the raised design due to the module. The second embodiment example with two thermo-adhesive layers 50 and 60 is more adapted to the case where the support layer is not embossed. However, this preference is not limiting.

The layers referenced 10, 40 and 70 in the case of the first embodiment example and 10, 50, 60 and 70 in the case of the second embodiment example are assembled with one another by lamination. The lamination step consists in subjecting all layers to an increase in temperature up to 150° C. and an increase in pressure from 0.5 bars up to a few bars (approximately 10 N/m$^2$) followed by a decrease in temperature and a decrease in pressure, the whole lot according to a set of cycles of defined duration. During lamination, the thermo-adhesive film of the layer 40 of the first example and the thermo-adhesive film of layers 50 and 60 of the second example fluidifies and traps the antenna and the module in the mass. The pressure exerted during lamination is directed perpendicular to the layers and thus perpendicular to the surfaces in contact of the groups of contacts 33 and 34 of the module with the contacts 13 and 14 of the antenna.

Figure 7:
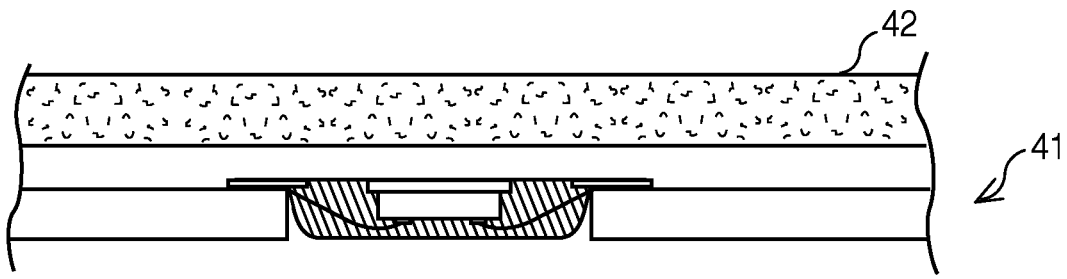
FIG. 7 represents a section of the RFID device support after lamination.
Figure 8:
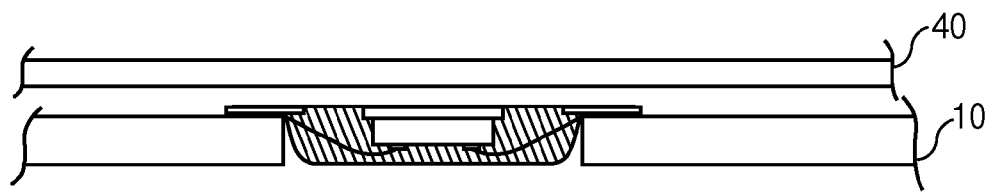
FIG. 8 represents a cross-sectional view of various layers that make up the RFID device support according to a first embodiment example of a variant of the invention.
Figure 9:
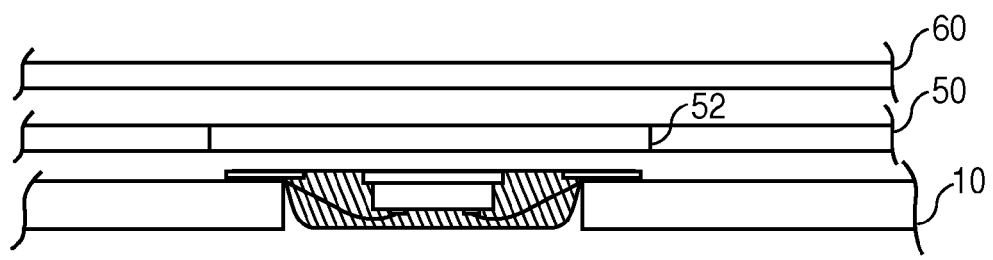
FIG. 9 represents a cross-sectional view of various layers that make up the RFID device support according to a second embodiment example of a variant of the invention.
Figure 10:
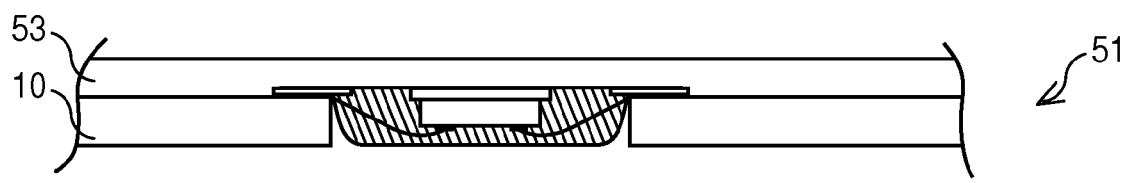
FIG. 10 represents a cross-sectional view of the RFID device support after the first lamination step according to the variant of the invention.
Figure 11:
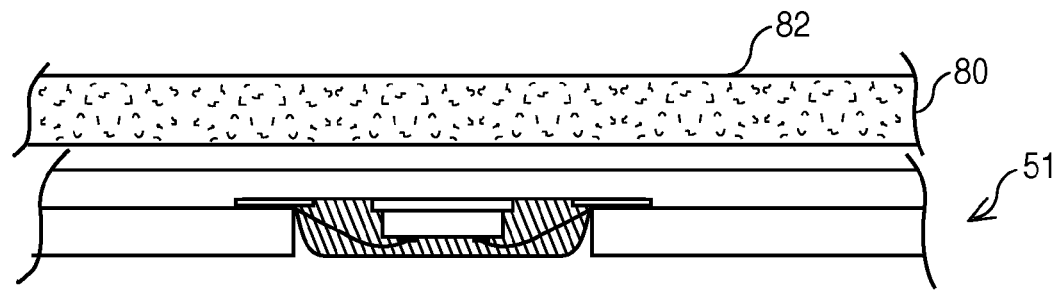
FIG. 11 represents a cross-sectional view of various layers that make up the RFID device support according to the variant of the invention.

FIG. 7 shows a cross-section of the module and the 3 layers of different materials after the lamination step. During the lamination step, the layers that make up the RFID device support reduce in thickness. The total thickness of layers before lamination reaches 680 μm which corresponds in detail to the following distribution:

Cover 70: 350 μm
two thermo-adhesive films of 40 μm,
Support layer 10: 250 μm.

After lamination, the sandwich obtained, known as the electronic cover in the description that follows, has a thickness between 640 μm and 650 μm.

During the lamination, a pressure is exerted on the entire module. The groups of contacts of the module press on the contacts of the antenna causing a deformation of contacts and the support layer 10. This deformation is in the form of an imprint whose inner surface exactly matches the outside surface of the groups of contacts. In this manner, there exists an intimate contact between the groups of contacts 33 and 34 of the module and the conductive ink of contacts 13 and 14 over a maximum contact surface. The material which makes up the support layer 10, as well as the conductive ink of the contacts 18, being deformable and non-elastic, these two materials do not tend to return to their original shape even when the pressure is released.

Furthermore, during the lamination, the thermo-adhesive film of layers 40 or 50 and 60 becomes soft and completely matches the contours of the inner face of the module. The thermo-adhesive film of layers 40 or 50 and 60 acts as a glue between the cover layer 70 and the layer of the antenna support 10 so that, once hardened, it adheres completely to both layers and to the module. The two layers 10 and 70 on either side of the thermoplastic layer are stressed under the effect of pressure during lamination and the stress applied is maintained on the groups of contacts of the module so that the electrical contact between the module and the antenna is permanent and reliable once the thermo-adhesive film of layers 40 or 50 and 60 has hardened.

Another embodiment method of the invention, illustrated in FIGS. 6 to 9 consists in creating a first pre-lamination step with layers that make up the support of the RFID device but without the cover layer 70. This pre-lamination consists in partially activating the layer 40 or the layers 50 and 60 of thermo-adhesive film in order to "glue" them to the antenna support 10 and by keeping the possibility of activating it (or activating them) once again during another lamination step. The pre-lamination step consists in subjecting all layers to an increase in temperature until a maximum temperature between 50° C. and 70° C. by maintaining it for 3 minutes and an increase in pressure. During the pre-lamination the thermo-adhesive film of the layer 40 of the first example of FIG. 8 and the thermo-adhesive film of layers 50 and 60 of the second example of FIG. 9 fluidifies and traps the antenna and the module in the mass. The support of the RFID device 51 obtained after this pre-lamination step is an antenna support fitted with an electronic module connected to the antenna. The support of the RFID device 51 features the layer 10 of the antenna support and a thermo-adhesive layer 53 corresponding to the initial layer 40 or initial layers 50 and 60 of the thermo-adhesive film. A layer 80 is placed on the thermo-adhesive film layer 53. The adhesive properties of the thermo-adhesive film layers 53 are re-activated under the action of heat. Thus, the layers 10, 53 and 80 are assembled to one another by lamination. This lamination step is similar to that described previously in FIGS. 5 to 7. Similarly, the electrical contact between the module and the antenna is permanent and reliable once the thermo-adhesive film of the layer 53 has hardened.

Figure 12:
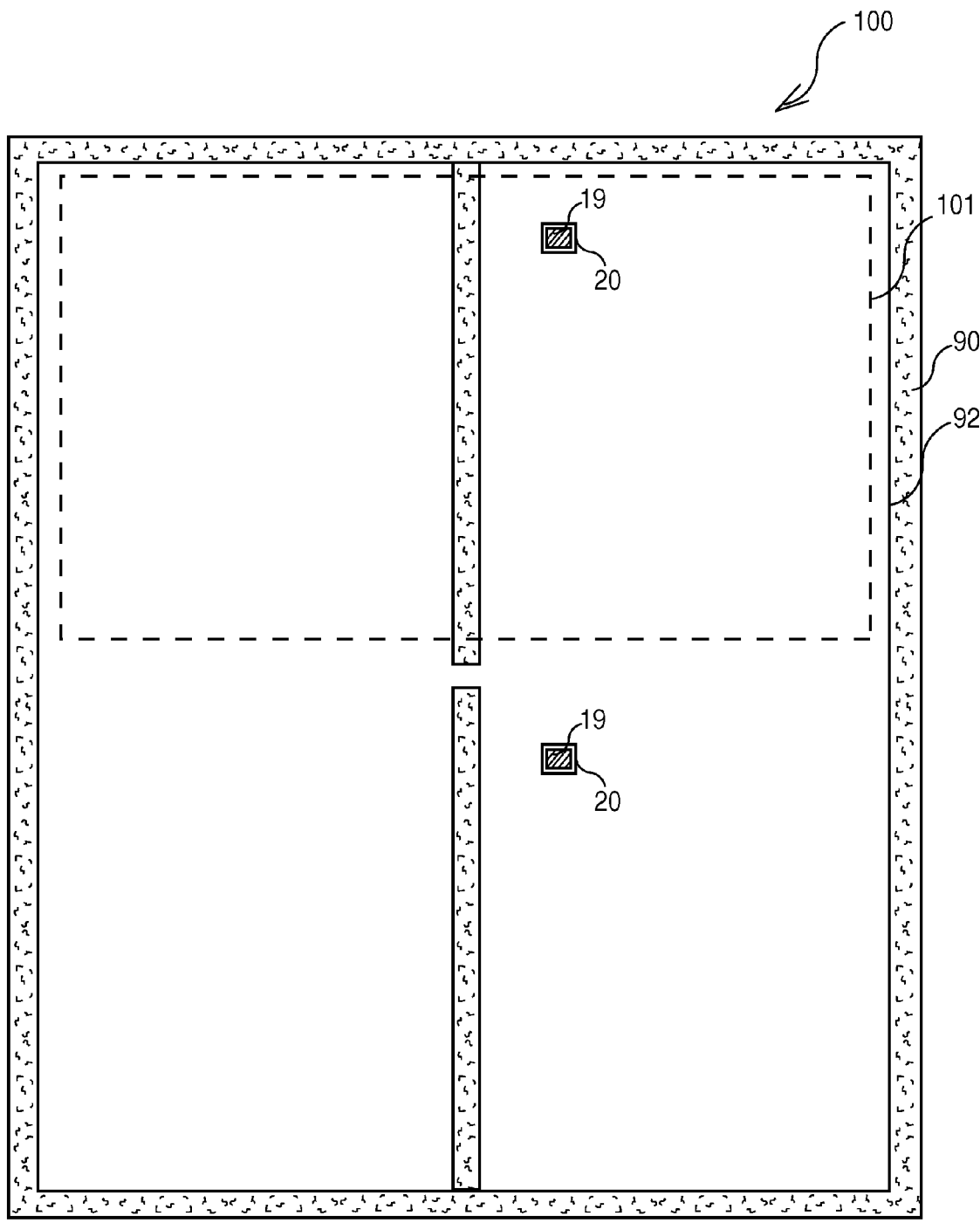
FIG. 12 represents two RFID device supports according to the invention and the cover of the identity booklet.

FIG. 12 shows the top view of a support 100 provided to be used as a cover equipped with an RFID device for a set of identity booklets. It features a cover layer 90 that has a width greater than the width of an identity booklet and a length that can contain several RFID device supports according to the invention. We can also see a layer 92 corresponding to the antenna support layer in paper or in synthetic paper and a group of modules 19 visible in the recesses 20 of the layer 92. The location of the cutout of an identity booklet is shown by a dotted line on the figure. The identity booklet is then completely formed by the installation of the quire of inside pages.

The manufacturing methods according to the invention provide a reliable and resistant radiofrequency identification device. Furthermore, the grain of the cover is not damaged during the lamination steps.

The invention claimed is:

1. A method for manufacturing an identity booklet cover provided with a radio frequency identification device (RFID), said device featuring an antenna and a chip connected to the antenna, said method comprising:
   manufacturing an antenna having contacts on a antenna support layer made of paper or synthetic paper,
   creating a recess between the contacts of the antenna,
   placing adhesive dielectric material on the antenna support layer near said antenna contacts, wherein said antenna contacts are U-shaped and the adhesive dielectric material is placed inside the U,
   positioning an integrated circuit module on said antenna support layer, said module featuring groups of contacts and the chip connected to groups of contacts inside an encapsulation of the module, so that the groups of contacts of said module are opposite said contacts of said antenna and the module is encapsulated into the recess,
   placing on a face of said antenna support layer featuring the antenna at least one layer of thermo-adhesive film,
   placing a cover layer on the layer(s) of thermo-adhesive film,
   laminating together the antenna support layer, the layer(s) of thermo-adhesive film and the cover layer.

2. The method of claim 1, wherein a step preliminary to the manufacturing step of the antenna consists in embossing on a thickness between 50 and 60 μm a portion of said antenna support layer at the location of the module, the embossing thus created being of a shape slightly larger than the module.

3. The method of claim 1, wherein the layer of thermo-adhesive film directly applied on the antenna support layer is provided with a recess at the location of the module, the shape of the recess is such that it matches the edges of a lower face of the module.

4. The method of claim 1, wherein the adhesive material applied to the antenna support layer is a cyanoacrylate glue.

5. The method of claim 1, wherein the synthetic paper of said antenna support layer is made of a material that does not deform when the temperature increases.

6. The method of claim 1, wherein said layer(s) of thermo-adhesive film have a thickness of 50 μm.

7. The method of claim 1, wherein said antenna is made by screen printing using conductive ink.

* * * * *